United States Patent [19]

Shohet

[11] Patent Number: 5,289,010

[45] Date of Patent: Feb. 22, 1994

[54] ION PURIFICATION FOR PLASMA ION IMPLANTATION

[75] Inventor: Juda L. Shohet, Madison, Wis.

[73] Assignee: Wisconsin Alumni Research Foundation, Madison, Wis.

[21] Appl. No.: 987,122

[22] Filed: Dec. 8, 1992

[51] Int. Cl.$^5$ .................................. H01J 37/317
[52] U.S. Cl. ........................ 250/492.21; 250/398
[58] Field of Search .............. 250/492.21, 398, 291, 250/290

[56] References Cited

U.S. PATENT DOCUMENTS

| | | | |
|---|---|---|---|
| 4,464,570 | 8/1984 | Allemann et al. | 250/291 |
| 4,471,003 | 9/1984 | Cann | 427/34 |
| 4,588,888 | 5/1986 | Ghaderi et al. | 250/291 |
| 4,739,165 | 4/1988 | Ghaderi et al. | 250/290 |
| 4,761,545 | 8/1988 | Marshall et al. | 250/291 |
| 4,764,394 | 8/1988 | Conrad | 427/38 |
| 4,818,864 | 4/1989 | Allemann | 250/291 |
| 4,859,908 | 8/1989 | Yoshida et al. | 250/492.21 |
| 5,126,163 | 6/1992 | Chan | 250/492.21 |

FOREIGN PATENT DOCUMENTS

| | | |
|---|---|---|
| 0480688A2 | 4/1992 | European Pat. Off. . |
| 0480689A2 | 4/1992 | European Pat. Off. . |

OTHER PUBLICATIONS

S. Picraux, et al., "Ion Implantation of Surfaces," Scientific American, vol. 252, No. 3, 1985, pp. 102–113.
T. L. Wang, et al., "Extension of Dynamic Range in Fourier Transform Ion Cyclotron Resonance Mass Spectrometry Via Stored Waveform Inverse Fourier Transform Excitation," Analytical Chemistry, vol. 58, No. 14, Dec. 1986, pp. 2935–2938.
J. L. Shohet, et al., "A Plasma Source for Fourier Transform Mass Spectrometry" Plasma Chemistry and Plasma Processing, vol. 9, No. 2, 1989, pp. 207–215.
R. Hatakeyama, et al., "An Efficient Mass Separation by Using Traveling Waves with Ion Cyclotron Frequencies," Nuclear Instruments and Methods in Physics Research B70, 1992, pp. 21–25.

Primary Examiner—Bruce C. Anderson
Attorney, Agent, or Firm—Foley & Lardner

[57] ABSTRACT

Plasma source ion implantation is carried out within an evacuated chamber having a target, such as a semiconductor wafer, supported on a target stage, with pulses of high voltage applied to the target periodically to implant ions from a plasma into the target. The ions in the plasma are purified after formation of the plasma by passing the plasma through an ion cyclotron resonance system composed of excitation electrodes and ion collector electrodes surrounding an ion purification region, with a magnet providing a unidirectional magnetic field through the ion purification region. A radio frequency time varying electric field from the excitation electrodes drives unwanted ions having charge-to-mass ratios greater than or less than that of the desired ion species to resonance with the electric field. During resonance, the undesired ions are driven outwardly in expanding spirals until reaching the ion collector plates, where the unwanted ions are removed. The purified plasma is passed to a plasma implantation region within the chamber from which the desired ions are implanted into the target as pulses of voltage are applied to the target. The ion purification may be carried out in a periodic manner between the repetitive pulses of voltage that are applied to the target.

11 Claims, 3 Drawing Sheets

ION PURIFICATION FOR PLASMA ION IMPLANTATION

This invention was made with U.S. Government support awarded by the National Science Foundation (NSF), Grant No. ECD-8721545. The U.S. Government has certain rights in this invention.

FIELD OF THE INVENTION

This invention pertains generally to the field of surface treatment by ion implantation, and particularly to ion implantation from a plasma.

BACKGROUND OF THE INVENTION

Ion implantation has been utilized to treat the surfaces of a variety of materials, including metals, ceramics and plastics, to change the surface characteristics of the materials. In a conventional ion implantation process, ions are formed into a beam in an ion gun and accelerated to high energy before being directed into the surface of a solid target. Such conventional ion implantation is utilized not only for surface treatment of materials to enhance hardness, wearability and so forth, but is also utilized in the microelectronics industry to implant ions into semiconductors to provide selective doping of the semiconductor. In the latter application, it is essential that the ions implanted into the semiconductor be carefully selected so that substantially only the desired ions are implanted.

The high cost of conventional ion implantation techniques limits the practicality of such techniques for surface treatment applications, e.g., surface hardening. Recently, a more efficient technique for implantation of ions into essentially all surfaces of a target object simultaneously from a plasma around the object has been developed. Such a technique, commonly called plasma source ion implantation (PSII) is disclosed in U.S. Pat. No. 4,764,394 by Conrad, issued Aug. 16, 1988. The plasma around the target is the source of the ions which are implanted in the target. A high negative potential pulse is applied to the target to accelerate ions from the plasma across a plasma sheath toward the target in directions substantially normal to the surfaces of the target at the points where the ions impinge upon the surface of the target. Multiple pulses are typically applied to the target in rapid succession to perform multiple implantations until a desired concentration of implanted ions within the target is achieved.

In the PSII process, the creation of the plasma may be carried out in a variety of ways, typically by ionizing a neutral gas within the evacuated chamber surrounding the target. The ions may also be formed in an area separate from the main chamber and then transported into the main chamber where they form a plasma which is confined around the target. It is commonly the case that unwanted species of gas molecules are mixed with the neutral gas from which the ions are to be obtained. For example, nitrogen is often used for nitride ion implantation to improve the surface hardness of metal tools, but other gases may be found within the evacuated chamber with the nitrogen, e.g., oxygen mixed with the nitrogen, or even heavy molecules such as organic molecules that may be found within the evacuated chamber from outgassing of materials in the chamber or from leaks. These unwanted species may also be ionized and may be implanted from the plasma into the target. Generally, the presence of the unwanted ion species may be acceptable where the plasma source ion implantation is for surface hardening of many materials, but can be particularly detrimental where the electrical, mechanical, or chemical properties of the surface are crucial, as in semiconductor processing.

Furthermore, dopants used in semiconductor processing are often ionized from a working gas containing other elements, for example, boron trifluoride in the case of boron as the dopant, which inevitably generates ions of unwanted species. In conventional ion beam ion implantation, the unwanted ions are removed from the beam before it impinges on the target. However, in conventional plasma source ion implantation, all of the ionized species found in the plasma may be implanted.

SUMMARY OF THE INVENTION

In accordance with the present invention, ions in a plasma which are to be implanted in a target by the plasma source ion implantation process are purified to eliminate undesired ion species from the plasma before implantation. The purification is carried out by an ion cyclotron resonance (ICR) technique in which the ions in the plasma are subjected to a time varying electric field in the presence of a steady magnetic field, which is selected to drive the unwanted ion species into resonance, and thus out to larger orbits, than the wanted species, and ultimately to drive the unwanted species into contact with a collection plate or other collection means where the unwanted species can be entirely removed from the plasma. After the plasma has been purified, voltage pulses are applied to the target to implant the desired ion species into the target from the adjacent purified plasma. A substantial decrease in the processing time required to implant ions over large surfaces may thus be obtained as compared with ion guns for semiconductor processing applications, and greater control of surface characteristics may be obtained in surface hardening or modification applications. In addition, the equipment for carrying out implantation in accordance with the invention can be made compact so as to occupy much less floor space than conventional ion beam ion implantation equipment.

In the present invention, the ion plasma may be formed continuously and passed through a filter comprising an ICR system which drives out the unwanted species before the plasma is introduced into the plasma implantation region from which the ions in the plasma will be accelerated into the target. A solenoidal magnet provides a constant magnetic field to an ion purification region in the ICR system. Alternatively, the plasma may be generated adjacent the target in the plasma implantation region and may be purified in the intervals between the pulses of voltage applied to the target so that the plasma around the target is continuously purified. The latter case has the advantage of cleansing the plasma of unwanted species that may be created during the plasma source ion implantation process itself, e.g., as a consequence of impact of accelerated ions with neutral gas molecules in the volume surrounding the target. Where pulsed purification is carried out, the solenoidal magnet preferably also surrounds the target and provides a magnetic field which enables ion cyclotron resonance of the unwanted ion species to occur in a region adjacent the target, as well as to help focus, if desired, the flux of ions being implanted into the desired surface area of the target. For example, where a substantially planar target, such as a semiconductor wafer, is to be implanted, it may be desirable to concentrate the plasma in a volume directly above the planar surface of the wafer rather than surrounding it, which may be facilitated by the magnetic field of the ICR magnet.

Various techniques may be utilized to selectively excite the ICR system. These include frequency sweep excitation which sweeps through all of the resonant frequencies corresponding to the mass domain resonances of the undesired species, or excitation by composite signals which are selected to provide energy within selected bands of the mass domain to excite the undesired species to resonance.

Further objects, features and advantages of the invention will be apparent from the following detailed description when taken in conjunction with the accompanying drawings.

DETAILED DESCRIPTION OF THE INVENTION

Figure 1:
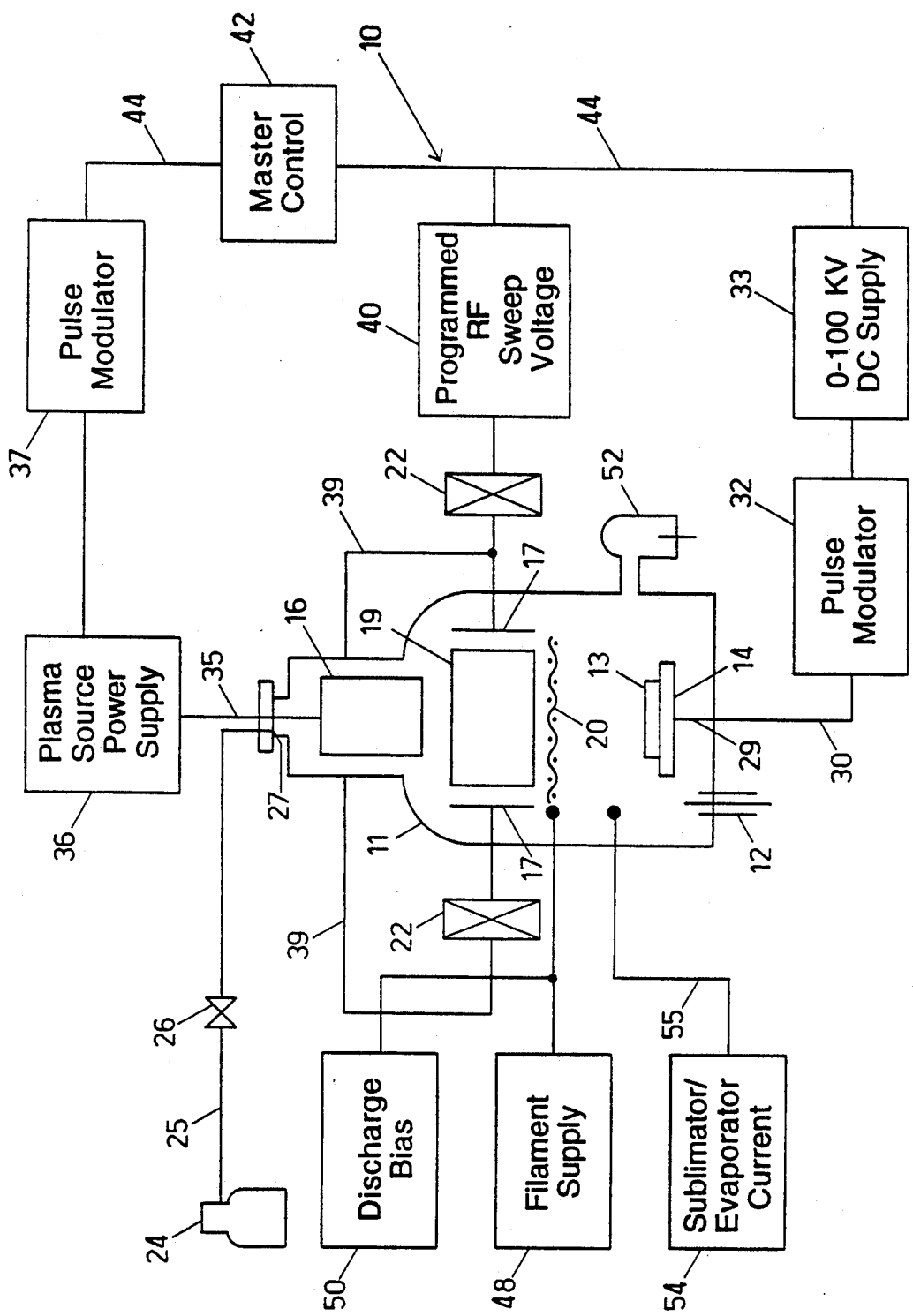
FIG. 1 is a simplified schematic view of the apparatus of the present invention including a cross-sectional view through an ion implantation chamber of the apparatus.

The present invention relates to the plasma source ion implantation process and apparatus of U.S. Pat. No. 4,764,394, the disclosure of which is incorporated herein by reference. In plasma source ion implantation as described in that patent, a gas is introduced into an evacuated chamber within which is mounted a target object on a conductive support arm, the gas within the chamber is ionized to create a plasma which surrounds the target, and high voltage pulses are applied between the conductive walls of the chamber and the target to provide implantation of ions from the plasma into the target. Various sources can be used to provide the plasma. Gases can be ionized in a variety of ways, such as using microwave and/or electron cyclotron resonance, radio frequency discharges, helicon, inductively coupled plasma sources, and filament discharges, or a combination of several sources can be used. Typically, the plasmas formed have several ion species resulting from ionization of the working gas, from ionization of other atoms or molecules which are created from collisions with the materials in the vacuum chamber, from evaporation (outgassing) of materials in the chamber, from unwanted impurities in the working gas, from sputtering of the surface being implanted or from leaks in the vacuum chamber.

In the present invention, purification of the plasma is carried out by accelerating the undesired ion species using ion cyclotron resonance (ICR) to sweep out the undesired ions to a collection region which is preferably not subjected to the high voltage acceleration pulse. The sweeping is done by using a combination of a constant magnetic field and a selected time varying electric field, typically at a radio frequency. The time varying electric field may be provided by various means, such as by applying a high frequency electrical signal to excitation electrodes, by using an exciter coil, and in other well known ways.

Ion cyclotron resonance is utilized in mass spectrometers to analyze the molecular content of a sample. ICR mass spectrometry techniques are well known. The application of a radio frequency time varying electric field and a constant unidirectional magnetic field to an ionized sample produces a resonance condition in which an ion in the fields can receive energy from the radio frequency electric field and be accelerated in a spiraling motion out to a collection electrode. Each ion has a particular resonance frequency which is determined by its charge-to-mass ratio and the magnitude of the magnetic field. This frequency, called the cyclotron resonance frequency, is defined as follows:

$$f_c = \frac{1}{2\pi} \frac{qB}{m}$$

where $f_c$ is the cyclotron resonance frequency in hertz, q is the charge of the ion in coulombs, m is the mass of the ion in kilograms, and B is the strength of the magnetic field in webers per square meter. Assuming a uniform and constant magnetic field transverse to the electric field, the ions receiving energy from a time varying electric field at their resonant frequency will orbit in resonance with the electric field in a spiral orbit which will increase in radius linearly with time in accordance with the formula:

$$r = \frac{E}{B} t$$

where r is the radius of the ion in meters, E is the electric field strength of the time varying electric field at the resonant frequency in volts per meter, B is the magnetic field strength in webers per square meter, and t is time in seconds. The foregoing formula is a simplification of the actual motion of ions in the electric and magnetic fields, but generally illustrates the fact that a relatively rapid increase in the radius of ions can be obtained in the presence of a modest magnetic field and an adequate time varying electric field. In the present invention, to obtain plasma filtering using ion cyclotron resonance effects, an extremely strong and uniform magnetic field is generally not required, as typically is the case for ion cyclotron resonance mass spectrometers. For example, solenoidal magnets formed of conventional conductors can be utilized since such magnets will produce adequate magnetic fields for the purposes of the invention. High precision ICR spectrometers commonly require superconducting magnets to provide adequately strong magnetic fields. Such superconducting magnets can, of course, also be utilized with the present invention if desired.

As an illustrative example of ion ejection by ion cyclotron resonance, assume an ICR cell containing 1 eV ions, mass number 10, with a 1 kilogauss (0.1 weber/square meter) magnetic field. The ion speed is $5 \times 10^{-4}$ m/sec. and the time for an ion to drift 0.5 meter is $1 \times 10^{-4}$ second (100 microseconds). If it is assumed that the radio frequency (r.f.) electric field excites this ion species for 10 microseconds, the r f. electric field required to achieve a radius of 0.5 meters (as predicted from the expression $$r = \frac{E}{B} t)$$

is 500 volts/meter. The ion cyclotron frequency, as determined from $$f_c = \frac{1}{2\pi} \frac{qB}{m},$$

is 0.15 MHZ, so that the period of the orbit is about 6.7 microseconds, allowing nearly two orbits during the resonant excitation. The energy of the ions may be less than 1 eV, and the magnetic field may be increased as well to give more orbits in the resonant time, with a corresponding increase in the excitation electric field.

In the present invention, selective excitation of the unwanted species can be obtained while little or no excitation is provided of the desired ion species. This can be accomplished, for example, by utilizing a frequency sweep or chirp excitation of the time varying electric field in which energy at certain frequencies, corresponding to the resonant frequencies of the desired ion species, is missing from the excitation signal.

With reference to the drawings, a plasma ion implantation apparatus having ion purification in accordance with the present invention is shown generally at 10 in FIG. 1. The apparatus 10 includes an enclosing chamber 11 having conductive walls, typically of stainless steel or aluminum, which forms the vacuum enclosure for the apparatus. The interior of the chamber 11 is connected via an outlet 12 to a vacuum pump (not shown). A target 13, such as a semiconductor substrate, is mounted on a target stage 14 within the interior of the chamber 11. Also mounted within the interior of the chamber 11 are a plasma source 16, ion cyclotron resonance excitation electrodes 17, an ion collector electrode 19, and an electrostatic shield grid 20. The electrostatic shield grid 20 is typically a mesh of electrical conductors which separates the ion purification region between the electrodes 17 from a plasma implantation region adjacent to the target 13, as explained further below.

Mounted around the enclosure 11 is a solenoidal magnet 22. The magnet 22 may be formed of conventional electrical conductors to which a direct current is applied from a conventional power supply (not shown), or may be formed as a superconducting magnet. The magnet 22 provides a substantially unidirectional, constant magnetic field in the volume between the plate-like electrodes 17 and the plates 19, which thereby effectively forms an ICR system. It is understood that another electrode 19, not shown in FIG. 1, may be spaced from the electrode 19 shown in FIG. 1, so that an ion purification region would be defined between the electrode plates 17 and the plates 19. It is understood that other structures than the plates 19 may be used as means for collecting unwanted ions, and structures other than the plates 17, e.g., a coil, may be used to provide the time-varying electric field. The solenoidal magnet 22 provides a magnetic field within the ion purification region which is substantially—although not necessarily—spatially and temporally constant. Although it is generally preferred that the magnetic field be substantially constant in both space and time, changes in the field can be accommodated by adjustment of the electric potential applied to the excitation electrode plates 17 so that the proper species are collected by the ion collection plates 19. Unlike ion cyclotron resonance spectrometers, the system of the present invention does not require high precision, but rather only that the unwanted species be ejected and that the desired species be substantially unaffected by the field, since the system is not required to make precise measurements of the expelled species. Hence, high precision is not required for the mechanical construction of the electrodes and the magnet or for the electronic drivers for these components.

In the plasma source ion implantation apparatus 10 of FIG. 1, the plasma is formed from a working gas which is introduced into the chamber 11 from a source 24 through a line 25, controlled by a valve 26, to an inlet orifice 27. The gas from the inlet 27 is ionized by the plasma source 16 to create a plasma which is caused to drift into the ion purification region. Once the ions are in the ion purification region, the time varying electric field from the excitation electrodes 17 serves to sweep out the undesired species, while the desired ion species are passed through the electrostatic shield grid 20 into the plasma implantation region between the grid 20 and the target substrate 13.

The target stage 14 is connected by a conductive support arm 29, which extends through and is insulated from the walls of the chamber 11, to a power supply conductor 30 which receives the voltage pulses from a pulse modulator 32. The pulse modulator 32 is supplied with voltage from a high voltage power supply 33. The application of high negative voltage pulses by the pulse modulator 32 to the target stage 14 to provide plasma source ion implantation into the target 13 may be carried out as described in U.S. Pat. No. 4,764,394. If the target 13 is not conductive, the target object to which the high voltage pulses are applied is effectively the target stage 14 on which the target 13 is supported.

The plasma source 16 receives power from a power line 35 which extends out through the chamber 11 to a plasma source power supply 36, which is itself controlled by a pulse modulator 37. Preferably, the plasma is generated by the plasma source 16 in pulses which are coordinated with the application of voltage pulses to the target stage 14, as described further below.

The electrode plates 17, or other electric field excitation structure, are provided with a time varying electrical signal on lines 39 provided from an r.f. signal generator 40.

A master controller 42, e.g., a general purpose computer, is connected via control lines 44 to the pulse modulator 37, to the programmed RF signal generator 40, and to the high voltage power supply 33 and the pulse modulator 32 to control each of these systems. Ancillary systems include a filament power supply 48 connected by a line 49 to the electrostatic shield grid 20, and a discharge bias supply 50 connected by a line 51 to the shield grid 20, to control the flow of ions through the shield grid 20 from the ion purification region to the plasma implantation 15 region. An ionization gauge 52 is attached to the chamber 11 to allow assessment of the state of ionization within the chamber, and a sublimator-/evaporator current power supply 54 is connected by a line 55 to a sublimator 56 within the evacuated chamber 11.

Figure 2:
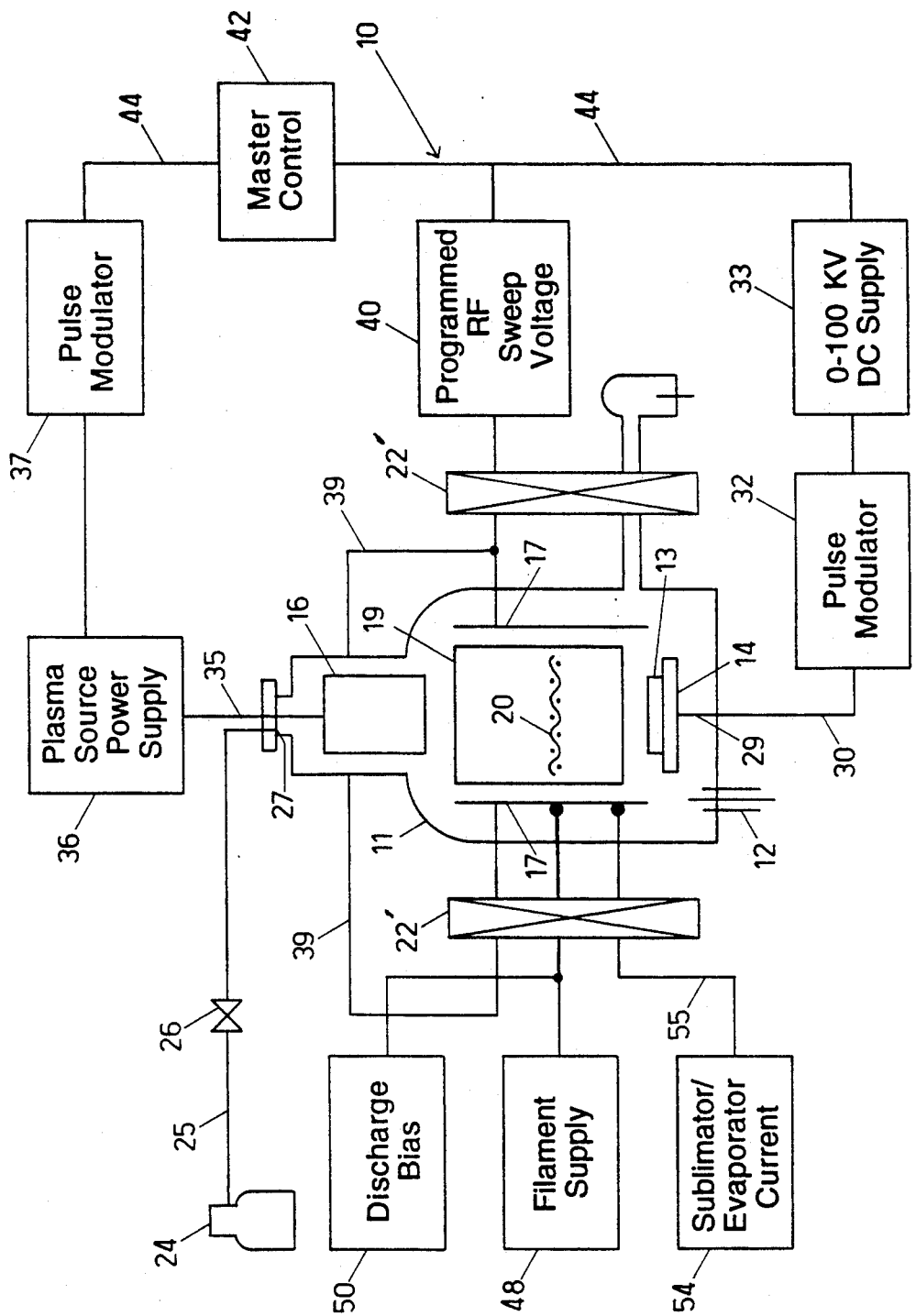
FIG. 2 is a simplified schematic view of a modified embodiment of the apparatus of the invention having an ICR magnet surrounding the plasma source and the target.

A modification of the apparatus of the invention is shown in FIG. 2 in which the ICR magnet 22' is elongated and substantially surrounds the entire active volume of the chamber 11, including the area of the target 13 as well as the excitation electrode plates 17 and the collector plates 19. The electrostatic shield grid 20, if used, may be located as shown in FIG. 2 at a position between the tops and bottoms of the relatively long plates 17 and 19. The electrostatic shield grid 20 may be utilized in the modified apparatus of FIG. 2 to separate an initial ion purification region above the grid 20 from a plasma implantation region below the grid 20. However, because the plates 17 and 19 extend below the grid 20, and the solenoidal magnet 22' extends below the grid 20 and surrounds the target substrate 13, ions within the plasma implantation region will be subjected to the same excitation electric field from the electrodes 17 as ions in the ion purification region above the grid. Consequently, unwanted ions in the plasma implantation region will also be accelerated by the electric field applied by the plates 17 into outwardly spiraling orbits until they contact the collector plates 19. In this way, unwanted ions generated during the ion implantation process can be removed.

Figure 3:
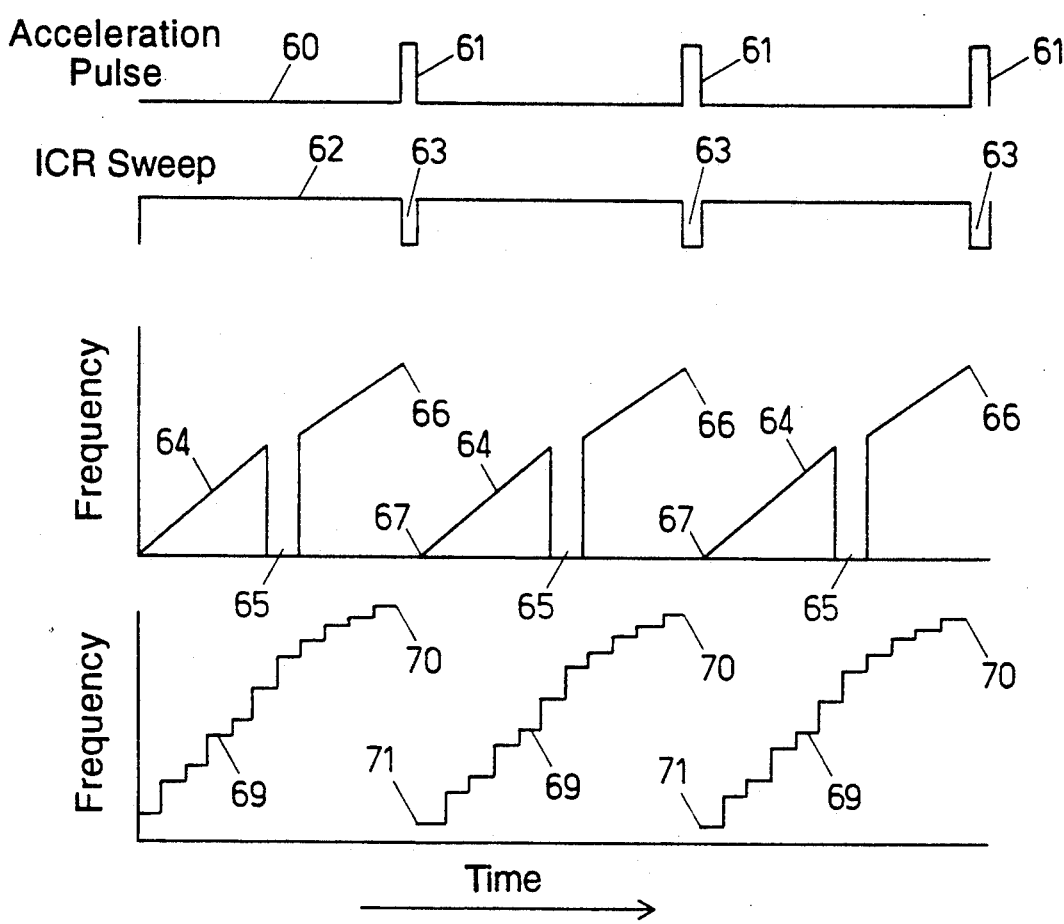
FIG. 3 are graphs illustrating exemplary excitation of the ICR purification cell between acceleration pulses, and illustrating the manner in which the frequency of the excitation may be selected to eject unwanted ion species.

Under appropriate conditions, the electrostatic shield grid 20 may be removed entirely so that the ion purification region becomes coextensive with the plasma implantation region. 10 The plasma source ion implantation process typically is a pulsed process. That is, acceleration of ions toward the target takes place only during the time that the high voltage acceleration pulse is applied through the pulse modulator. Typically, a voltage pulse in the range of 5 to 60 kilovolts is applied for a pulse length of 10 to 15 microseconds. The pulse rate may be as low as 1 per second (1 Hz) and may be higher than 100 Hz, although the typical pulse rate is in the range of 10 to 100 Hz. Thus, there is generally an interval between pulses of 9000 to 10,000 microseconds even at a pulse rate of 100 Hz, and, of course, there are longer intervals for slower pulse rates. Thus, sufficient time is available between acceleration pulses to perform an ion cyclotron resonance purification on ions in the ion purification region or in both the ion purification and plasma implantation regions. The sequence is illustrated by the graphs of FIG. 3, in which the voltage applied to the target is illustrated by the graph 60 as a function of time, consisting of a series of short duration pulses 61. The ion cyclotron resonance excitation is illustrated by the graph 62, showing excitation at all times except for turn off periods 63 during the pulses 61 (the turn-off period 63 generally being initiated shortly before the pulse and terminating shortly after the pulse).

The electrical signal applied to the excitation electrodes 17 to generate the time varying excitation electric field within the ion purification region can follow a variety of functions. By way of example only, the electrical signal applied to the plates may be a constant amplitude sinusoidal signal that varies continuously in frequency as a function of time during the interpulse interval. One example of such a function over the interval is illustrated by the graph 64 of FIG. 3, which shows the frequency of a sinusoidal signal having a constant amplitude. The frequency, as illustrated by the graph 64, increases linearly with time during the interpulse interval except for an interruption for a block of time 65, during which no signal is applied, which covers a frequency range corresponding to the mass domain frequency of the desired ions, and thereafter the signal frequency increases linearly to an end frequency 66 at a time just prior to application of the acceleration pulse 61. At that point in time, the electric field excitation signal is removed from the excitation electrodes 17 until after the pulse 61, after which the excitation signal is again applied beginning at a point 67 which is just after the end of the pulse 61.

An alternative excitation is shown by the graph 69, which represents the frequency of a constant magnitude sinusoidal electrical signal applied to the electrodes 17. This signal has a step-wise increasing, or staircase, frequency as a function of time, beginning at a point in time 71 just after the end of the pulse 61 at a desired minimum frequency and indexing up at discrete frequency increments to an end frequency at a time 70 which is just prior to application of the pulses 61. Because the function 69 increases in discrete increments, certain frequencies are avoided altogether. Thus, a very large step may be taken in the function 69 beginning at a frequency below the mass domain resonant frequency of the desired ions and jumping up to a frequency higher than the mass domain resonant frequency of the desired ions.

A great variety of excitation functions are known for use in ion cyclotron resonance mass spectrometry, and in particular, in Fourier transform mass spectrometry, which are suited for exciting specific ranges of ion masses while providing less or no excitation to other ranges of masses. Examples of such ion excitation techniques are described in U.S. Pat. No. 4,761,545 to Marshall, et. al. entitled Tailored Excitation For Trapped Ion Mass Spectrometry, and in Wang, et. al., "Extension of Dynamic Range In Fourier Transform Ion Cyclotron Resonance Mass Spectrometry via Stored Waveform Inverse Fourier Transform Excitation," Analytical Chemistry, Vol. 58, No. 14, December 1986, pp 2935-2938.

It is understood that the invention is not confined to the embodiments described herein as illustrative, but embraces all such forms thereof as come within the scope of the following claims.

What is claimed is:

1. A method of implanting ions into a target object comprising the steps of:
    (a) positioning the target object in an enclosing chamber;
    (b) generating a plasma;
    (c) providing a constant magnetic field and applying a time varying electric field to the plasma in an ion purification region within the chamber to selectively excite unwanted ions of unwanted species in the plasma having charge to mass ratios different than that of desired ions to eject the unwanted ions and leave a purified plasma; and
    (d) applying a high negative voltage pulse to the target object to accelerate ions in the purified plasma toward the target object.

2. The method of claim 1 including the step of transporting the purified plasma from the ion purification region to a plasma implantation region adjacent to the target object before applying the voltage pulse to the target object.

3. The method of claim 1 wherein the step of applying a high voltage pulse to the target object is carried out repetitively at spaced intervals of time and wherein the step of applying a time varying electric field to the plasma in the ion purification region is carried out repetitively during the intervals of time between voltage pulses applied to the target object.

4. The method of claim 1 wherein, in the step of applying a time varying electric field to the plasma in the ion purification region, the electric field is a time varying function of time which is a sinusoidal function having a frequency increasing with time over a predetermined interval which omits selected frequencies corresponding to the resonant frequencies of the desired ions.

5. The method of claim 1 wherein in the step of providing a magnetic field to the plasma, a substantially constant magnetic field is provided to a region within the enclosing chamber which includes both the ion purification region and the target object, and wherein the time varying electric field is applied to the plasma after each pulse of voltage is applied to the target object.

6. The method of claim 1 including the step of generating a plasma at a position out of the ion purification region, transporting the plasma to the ion purification region, then performing the step of applying a time varying electric field to the plasma in the ion purification region to provide a purified plasma, and then transporting the purified plasma to a plasma implantation region adjacent to the target object before the step of applying a voltage pulse to the target object.

7. Apparatus for implanting ions in a target object comprising:
 (a) electrically conductive enclosure walls defining an enclosing chamber surrounding a sealed space;
 (b) means for supporting a target object within the enclosing chamber at a position spaced away from and electrically isolated from the enclosure walls of the chamber and for providing an electrical connection between the target object and the exterior of the chamber;
 (c) means for forming a plasma;
 (d) a magnet mounted to provide a constant magnetic field in an ion purification region in the enclosing chamber, and ion collector means for collecting and holding ions mounted in the enclosing chamber at the ion purification region;
 (e) excitation means for applying a time varying electric field to a plasma in the ion purification region to excite unwanted ions in the plasma into resonance to eject such ions into the ion collector means without ejecting desired ions to provide a purified plasma; and
 (f) means for applying a pulse of voltage between the enclosure walls and the target object sufficient to implant ions from the purified plasma into the target object.

8. The apparatus of claim 7 wherein the ion purification region and a plasma implantation region adjacent the target object are separated by an electrostatic shield grid, and means for maintaining the shield grid at a potential during the application of the pulse to the target object to shield the ions in the ion purification region from the voltage applied to the target object.

9. The apparatus of claim 7 wherein the magnet surrounds both the ion purification region and the target object and wherein the excitation means applies a time varying electric field to the region adjacent to the target object.

10. The apparatus of claim 7 wherein the ion collector means comprises ion collection plates mounted adjacent the ion purification region.

11. The apparatus of claim 7 wherein the excitation means includes excitation electrode plates mounted at the ion purification region.

* * * * *